(12) United States Patent
Das et al.

(10) Patent No.: US 10,690,512 B2
(45) Date of Patent: *Jun. 23, 2020

(54) ANALYSIS OF SMART METER DATA BASED ON FREQUENCY CONTENT

(71) Applicant: EMC IP Holding Company LLC, Hopkinton, MA (US)

(72) Inventors: Kaushik K. Das, Belmont, CA (US); Rashmi Raghu, San Jose, CA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/983,294

(22) Filed: May 18, 2018

(65) Prior Publication Data

US 2018/0266848 A1 Sep. 20, 2018

Related U.S. Application Data

(63) Continuation of application No. 14/136,368, filed on Dec. 20, 2013, now Pat. No. 10,001,389.

(51) Int. Cl.
*G01D 4/00* (2006.01)
*H04Q 9/00* (2006.01)
(Continued)

(52) U.S. Cl.
CPC .............. *G01D 4/002* (2013.01); *G01D 4/004* (2013.01); *H04Q 9/00* (2013.01); *G01D 4/00* (2013.01);
(Continued)

(58) Field of Classification Search
CPC .......... G01D 4/00; G01D 4/002; G01D 4/004; G01D 4/10; G01D 4/18; G01R 22/066;
(Continued)

(56) References Cited

U.S. PATENT DOCUMENTS 7,920,983 B1 * 4/2011 Peleg .................. G01M 3/2807
137/1
8,781,768 B2 * 7/2014 Gershinsky .............. H04Q 9/00
702/62

(Continued)

OTHER PUBLICATIONS

Accenture, "Achieving High Performance with Theft Analytics", 2011.
(Continued)

*Primary Examiner* — Franklin D Balseca
(74) *Attorney, Agent, or Firm* — Van Pelt, Yi & James LLP

(57) ABSTRACT

Analysis of smart meter and/or similar data based on frequency content is disclosed. In various embodiments, for each of a plurality of resource consumption nodes a time series data including for each of a series of observation times a corresponding resource consumption data associated with that observation time is received. At least a portion of the time series data, for each of at least a subset of the plurality of resource consumption nodes, is transformed into a frequency domain. A feature set based at least in part on the resource consumption data as transformed into the frequency domain is used to detect that resource consumption data associated with a particular resource consumption node is anomalous.

31 Claims, 6 Drawing Sheets

(51) Int. Cl.
*G01R 23/00* (2006.01)
*G01R 23/16* (2006.01)
*G01R 22/06* (2006.01)

(52) U.S. Cl.
CPC ............ *G01R 22/066* (2013.01); *G01R 23/00* (2013.01); *G01R 23/16* (2013.01); *H04Q 2209/00* (2013.01); *H04Q 2209/10* (2013.01); *H04Q 2209/40* (2013.01); *H04Q 2209/60* (2013.01); *H04Q 2209/823* (2013.01); *Y02B 90/242* (2013.01); *Y04S 20/322* (2013.01); *Y04S 20/36* (2013.01)

(58) Field of Classification Search
CPC ......... G01R 23/00; G01R 23/16; Y04S 20/30; Y04S 20/36; Y04S 20/40; Y04S 20/322; H04Q 9/00; H04Q 2209/00; H04Q 2209/10; H04Q 2209/40; H04Q 2209/60; H04Q 2209/823; Y02B 90/242
See application file for complete search history.

(56) References Cited

U.S. PATENT DOCUMENTS

| | | | | |
|---|---|---|---|---|
| 8,885,929 | B2* | 11/2014 | Ni | G08G 1/0175 382/159 |
| 9,753,455 | B2* | 9/2017 | Drees | G05B 15/02 |
| 2007/0247331 | A1* | 10/2007 | Angelis | G01D 4/006 340/870.02 |
| 2008/0074284 | A1* | 3/2008 | Edwards | G01D 4/002 340/870.02 |
| 2012/0036250 | A1* | 2/2012 | Vaswani | G01D 4/004 709/224 |
| 2013/0159016 | A1* | 6/2013 | Ali | G16H 40/20 705/3 |
| 2014/0067325 | A1* | 3/2014 | McKee | H04Q 9/00 702/183 |
| 2014/0074614 | A1* | 3/2014 | Mehanian | G06Q 30/0267 705/14.64 |
| 2014/0358839 | A1* | 12/2014 | Dhurandhar | G01D 4/00 706/48 |
| 2016/0041565 | A1* | 2/2016 | Edwards | E03C 1/00 700/282 |

OTHER PUBLICATIONS

Author Unknown, "Smart Metering—Enabling Greater Energy Efficiency", Alcatel Lucent, 2007.
Bagnall et al., "A Likelihood Ratio Distance Measure for the Similarity Between the Fourier Transform of Time Series", Advances in Knowledge Discovery and Data Mining, Springer Berlin Heidelberg, 2005, pp. 737-743.
Chandola et al, "Anomaly Detection: A Survey", Sep. 2009, pp. 1-72.
Jardini et al., "Daily Load Profiles for Residential, Commercial and Industrial Low Voltage Consumers", IEEE Transactions on Power Delivery, vol. 15, No. 1, Jan. 2000, pp. 375-380.
Margineantu et al., "Data Mining Methods or Anomaly Detection", Aug. 21, 2005, pp. 1-85.
Michalis Vlachos, "A Practical Time-Series Tutorial with MATLAB", 2005.
Sanders et al, "Evaluating Electricity Usage Patterns for Reducing Energy Consumption and Minimizing Costs", IPENZ Conference 98: The sustainable city; vol. 2; Electrotechnical: simulation and control; energy management: telecommunications. Institution of Professional Engineers New Zealand, 1998 pp. 128-133.
Tries et al, "Understanding Energy Use in New Zealand Homes", Electricity Engineers' Association Annual Conference and Trade Exhibition, Auckland, Jun. 16-17, 2000, No. 79.
Vlachos et al., "On Periodicity Detection and Structural Periodic Similarity", SIAM International Conference on Data Mining, 2005.

* cited by examiner

ANALYSIS OF SMART METER DATA BASED ON FREQUENCY CONTENT

CROSS REFERENCE TO OTHER APPLICATIONS

This application is a continuation of co-pending U.S. patent application Ser. No. 14/136,368, entitled ANALYSIS OF SMART METER DATA BASED ON FREQUENCY CONTENT filed Dec. 20, 2013 which is incorporated herein by reference for all purposes.

BACKGROUND OF THE INVENTION

Smart meters provide an ability to monitor resource consumption at respective resource consumption nodes, for example, electrical or other energy usage in a home, business, or other location, in a more detailed and granular manner than under prior approaches. Whereas, a traditional meter might have a single value (e.g., kilowatt-hours, cubic feet, etc.) read manually from time-to-time, a smart meter may be configured to report consumption and other attributes at much more frequent and regular intervals, such as hourly.

Traditionally, problems with energy or other resource usage, such as downed lines, damaged equipment, fraud or other theft of the resource, etc. have been difficult to detect and have required extensive resources to address. For example, a utility worker and associated vehicle may have to be dispatched to investigate a reported problem, and such a report may only be received if a consumer or other person happens to notice a problem.

Aggregate (e.g., monthly) usage values have been compared to detected and flag significant changes in resource consumption, such as comparing consumption in a particular month in the current year to corresponding consumption by the same consumer in a prior year, but in current approaches it may be difficult to determine without costly effort (e.g., by a human operator) that the change in consumption as compared to a corresponding period in a prior year is indicative of a problem and if so the nature of the problem and how it should be addressed.

BRIEF DESCRIPTION OF THE DRAWINGS

Various embodiments of the invention are disclosed in the following detailed description and the accompanying drawings.

DETAILED DESCRIPTION

Figure 1:
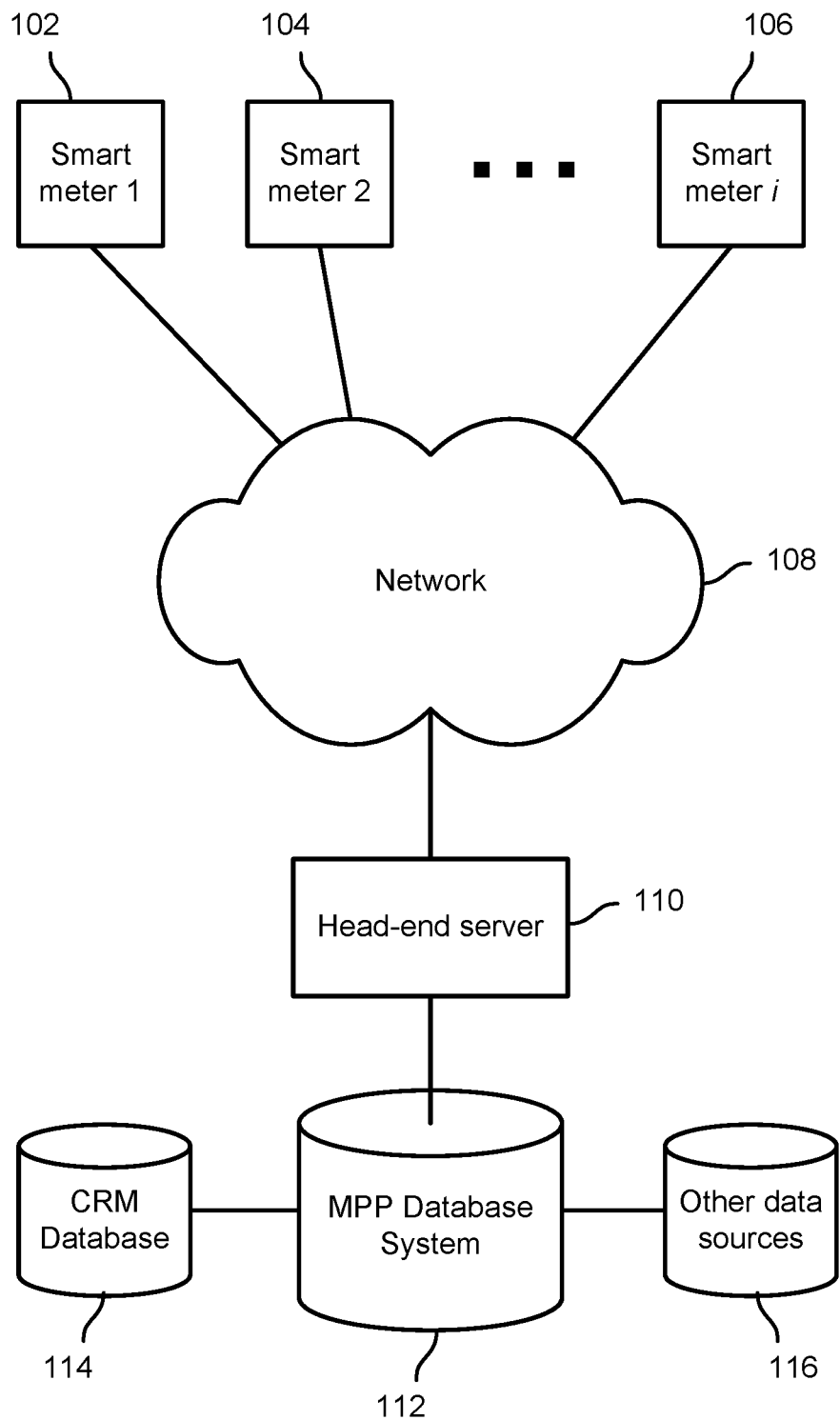
FIG. 1 is a block diagram illustrating an embodiment of a resource usage anomaly detection system and environment.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Techniques to detect anomalous resource usage are disclosed. In various embodiments, for each of a plurality of resource consumption nodes a time series data including for each of a series of observation times a corresponding resource consumption data associated with that observation time is received. At least a portion of the time series data, for each of at least a subset of the plurality of resource consumption nodes, is transformed into a frequency domain. A feature set based at least in part on the resource consumption data as transformed into the frequency domain is used to detect that resource consumption data associated with a particular resource consumption node is anomalous.

In some embodiments, cluster analysis is performed to determine one or more clusters of resource consumption nodes. Resource consumption nodes that do not fall within a prescribed "normal" boundary of a corresponding cluster of resource consumption nodes are determined to be anomalous. In some embodiments, a label or other identification of a specific anomaly may be determined and associated with a resource consumption node determined to have exhibited anomalous behavior. The label or other identification may be used in various embodiments to initiate programmatically a specific responsive action associated with the specific anomaly that has been detected.

FIG. 1 is a block diagram illustrating an embodiment of a resource usage anomaly detection system and environment. In the example shown, a plurality of smart meters, represented in FIG. 1 by smart meters 102, 104, and 106, each monitors resource consumption and/or other parameters at a location with which the smart meter is associated, such as a home or business at which the smart meter is installed. The respective meters report data via a network 108, which may include one or more of a peer-to-peer network, an RF or other mesh network, a cellular or other telecommunications network, the Internet, etc. Results reported via network 108 are received at a head-end server (or other head-end system) 110, and in the example shown are provided to a massively parallel processing (MPP) database system 112, such as the Pivotal™ Greenplum™ database system. In the example shown in FIG. 1, the MPP database system 112 has access to a customer relationship management (CRM) database 114, in which customer information associated with customer locations at which the smart meters such as smart meters 102, 104, and 106 are installed may be stored. In addition, in the example shown the MPP database system 112 receives input from one or more other external data sources 116. Examples of other external data sources may include, without limitation, information concerning weather or other environmental conditions, economic activity data, news or other event data, and data associating specific or general consumer locations with one or more attributes, such as income, character of land use, etc. In various embodiments, information derived from one or both of the CRM database 114 and other data sources 116 may be used together with corresponding information reported by smart meters such as meters 102, 104, and 106 to perform anomaly detection analysis as disclosed herein.

Figure 2:
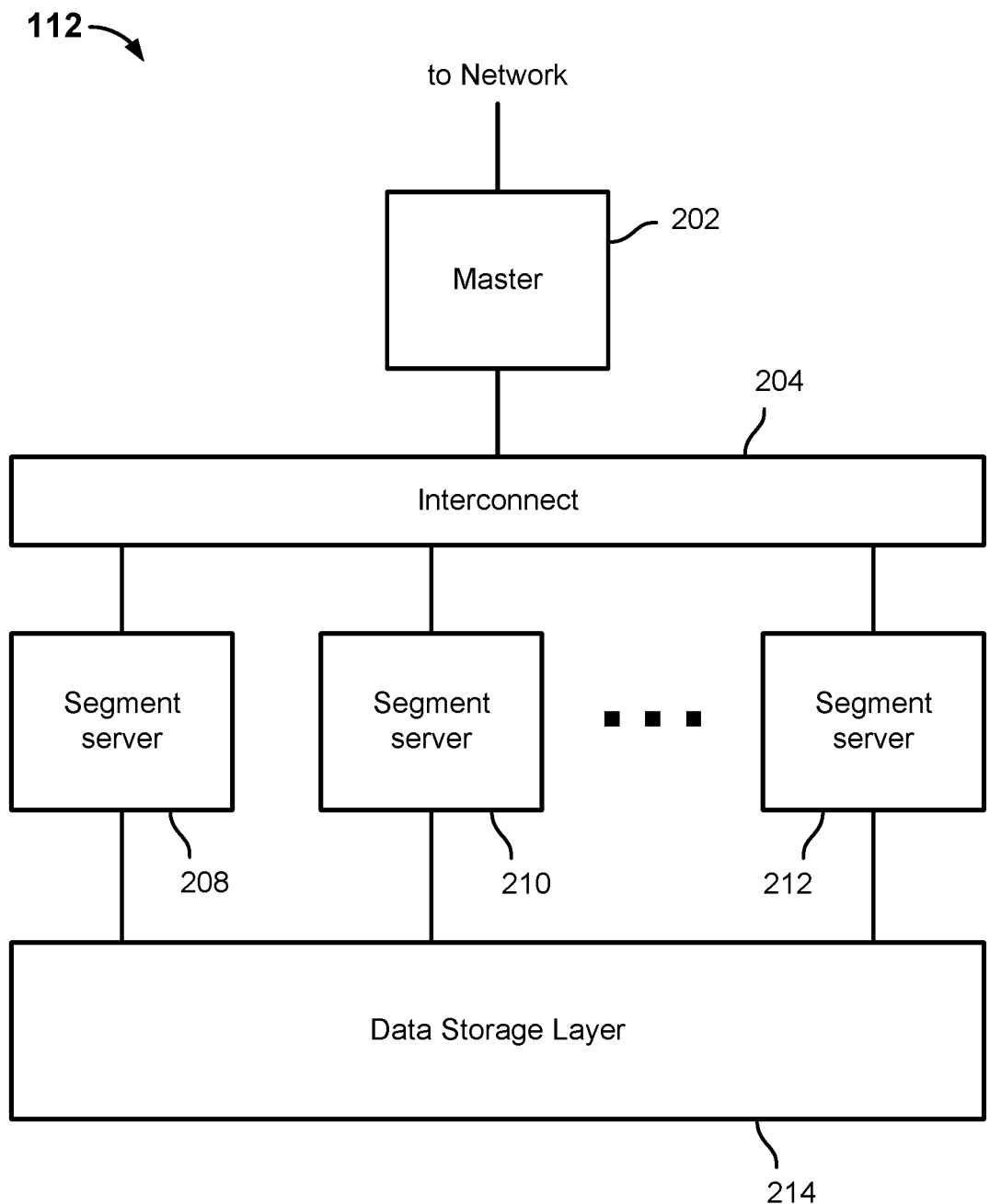
FIG. 2 is a block diagram illustrating an embodiment of an MPP database system comprising a resource usage anomaly detection system.

FIG. 2 is a block diagram illustrating an embodiment of an MPP database system comprising a resource usage anomaly detection system. In the example shown, the MPP database system 112 includes a master node 202 having a network connection via which resource consumption and related data reported by respective smart meters may be received. The master node communicates via an interconnect 204 with a plurality of segment servers, represented in FIG. 2 by segment servers 208, 210, and 212. In various embodiments, the master node 202 coordinates the parallel processing and storage in a back end data storage 214 of resource consumption data received from smart meters such as meters 102, 104, and 106 of FIG. 1. Examples of data storage 214 include, without limitation, a large scale distribute storage layer built on the Apache™ Hadoop™ framework. In other embodiments, other data storage devices, systems, and/or layers may be used.

In various embodiments, the segment servers (e.g., 208, 210, and 212) comprising MPP database system 112 process in parallel smart meter and associated data from potentially many thousands of smart meters.

Figure 3:
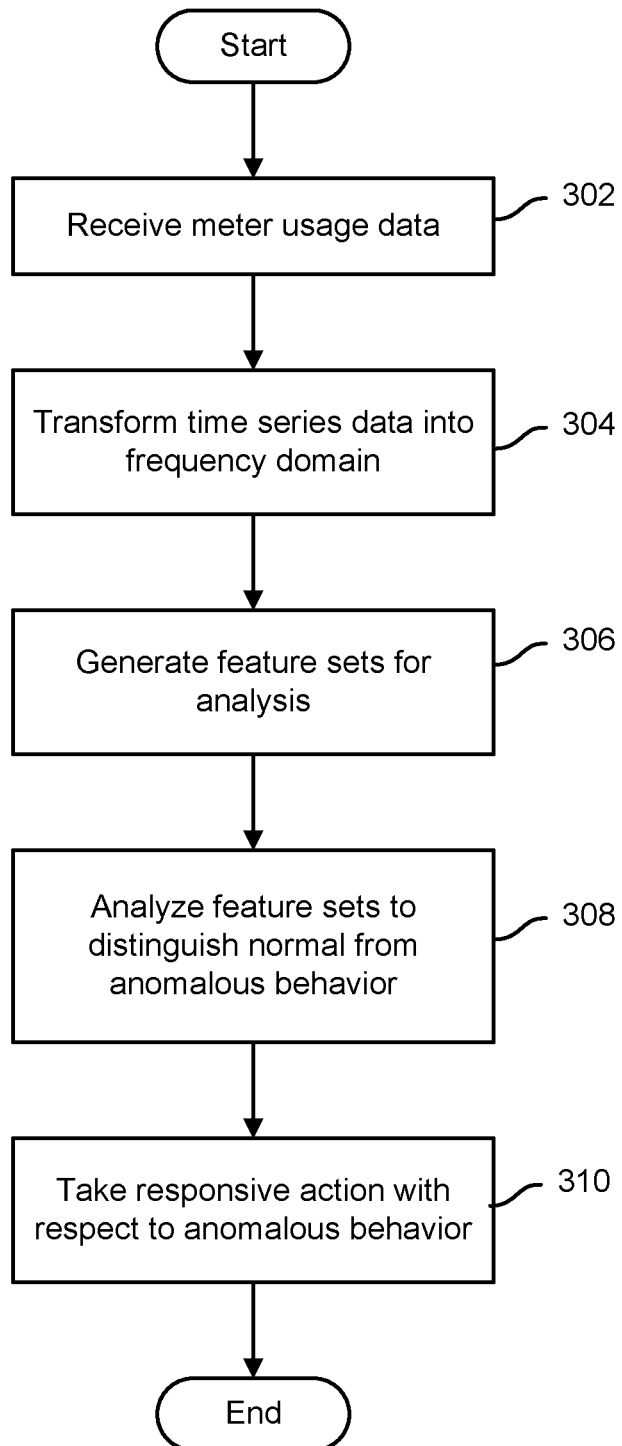
FIG. 3 is a flow chart illustrating an embodiment of a process to detect anomalous resource consumption.

FIG. 3 is a flow chart illustrating an embodiment of a process to detect anomalous resource consumption. In various embodiments, an MPP database system such as MPP database system 112 of FIGS. 1 and 2 may implement the process of FIG. 3. In the example shown, smart meter data is received (302). In various embodiments, the received smart meter data may include one or more of energy or other resource consumption over each of a plurality of intervals of a prescribed duration (e.g., per hour increment, per fifteen minute increment); an identification of the smart meter with which the data is associated; a timestamp or other indication of when the report was sent; and one or more other values, such as voltage or other service-related parameters as measured at the reporting site, etc. For each meter, for example, received smart meter data associated with power usage (or other resource consumption) for successive intervals, and/or in some embodiments voltage provided or other observed values reported for successive intervals, is stored, e.g., in an array, as a time series. In some embodiments, the received data may be subject to a validation and "scrubbing" or "cleaning" phase. This may include checking for missing data, ignoring missing data, and/or imputing values to fill in any gaps in the received data.

Each of at least a subset of the time series is transformed into a frequency domain (304), e.g., by applying a Fourier transform. For each meter, a feature set based at least in part on the smart meter data as transformed into the frequency domain is generated (306). For example, in some embodiments, magnitudes computed using the Fourier transform are included in the feature set. The feature sets generated for the respective meters are analyzed to distinguish normal from anomalous resource consumption behaviors (308). For example, in various embodiments, cluster analysis is used to determine one or more clusters of meters (based on the above-described feature sets), which are associated with normal behavior, and to identify meters determined to fall outside the "normal" boundary of a cluster to be associated with potentially anomalous behavior. In various embodiments, the "normal" threshold is chosen by a user and/or is determined by iterative investigation. In some embodiments, a clustering algorithm places anomalous/outlier smart meters (or other nodes) into clusters, but any that are more than a prescribed distance away from the cluster (e.g. from the cluster centroid) as determined by the threshold are considered to be potentially anomalous. Responsive action is taken with respect to meters determined to be associated with anomalous behavior (310). Examples of responsive action may include, without limitation, generating a flag, report, alert, or other communication; generating a task to perform further investigation; dispatching a resource to address a determined or suspected underlying cause of the anomaly; etc.

Figure 4:
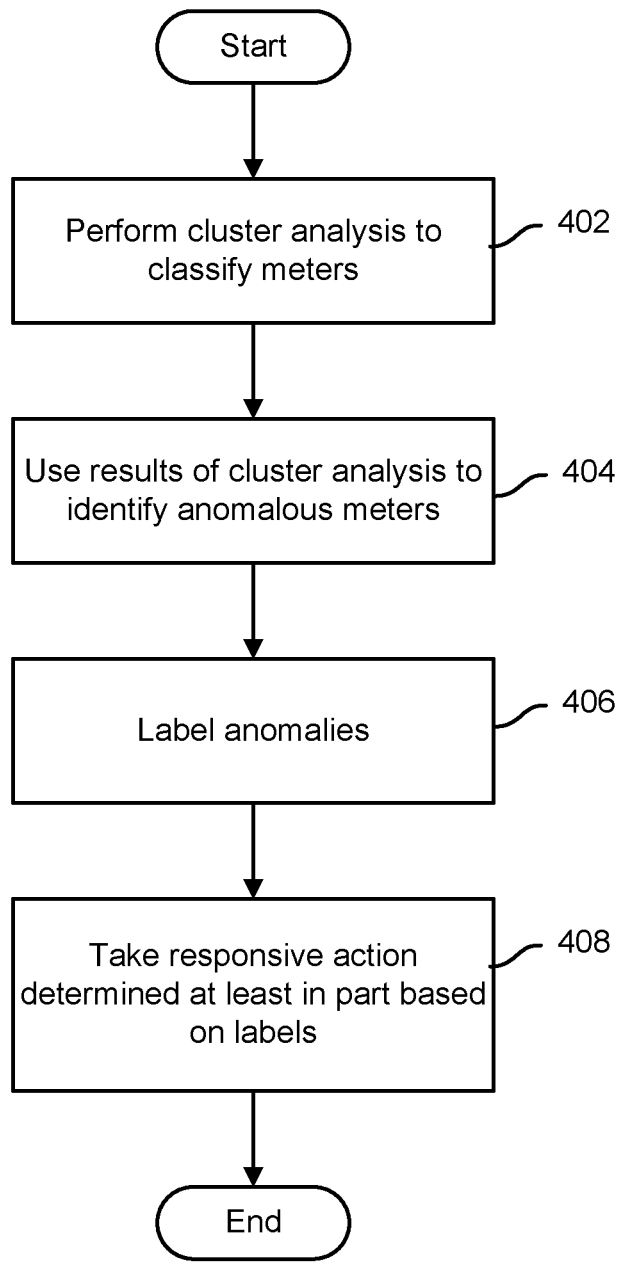
FIG. 4 is a flow chart illustrating an embodiment of a process to detect and respond to anomalous resource consumption.

FIG. 4 is a flow chart illustrating an embodiment of a process to detect and respond to anomalous resource consumption. In the example shown, cluster analysis is performed, e.g., on feature sets generated as described above, to classify meters, i.e., by associating each with a cluster with which it is determined via the cluster analysis to be most closely associated (402). The results of the cluster analysis are used to identify anomalous meters (404). For example, meters that are determined to fall outside a prescribed boundary of a cluster with which the meter is most closely associated, e.g., more than a prescribed distance from a determined center of the cluster, may be identified as being anomalous. For each of at least a subset of the meters determined to be associated with anomalous observed (i.e., reported) usage/behavior, an associated anomaly label (or other identifier) is determined (406). In some embodiments, labels are defined by performing analysis on a set of training data to determine for anomalous meters having one or more characteristic values and/or dimensions or axes along which they are like one another but different than non-anomalous meters that fall within a cluster with which the anomalous meters are most closely associated an underlying business, environmental, and/or other cause associated with the anomaly. For example, in the field of electrical power usage, certain anomalous patterns of usage may be associated with a "vegetation" related breakdown in the infrastructure (e.g., a power line that has been damaged by contact with trees or other vegetation), while others may be indicative of fraudulent usage, such as energy theft, or conducted commercial operations in a residential property under residential utility rates, etc. Referring further to FIG. 4, responsive action is taken based at least in part on the labels assigned to the various anomalies (408). For example, for anomalies determined and labeled to be vegetation related, a truck or other resource may be dispatched to investigate and take corrective action, such as trimming vegetation as needed, whereas for anomalies determined and labeled as being associated with possible fraud or theft an investigator may be assigned to investigate. In various embodiments, all of part of the process of FIG. 4 may be performed in whole or in part without human intervention, e.g., programmatically. In some embodiments, a degree of confidence associated with applicability of a given label to a given anomaly may be used to determine whether (more fully) automated responsive action is initiated, or if instead an alert or task is generated to cause a human operator to evaluate the meter and related data to determine and/or confirm the correct responsive action.

Figure 5:
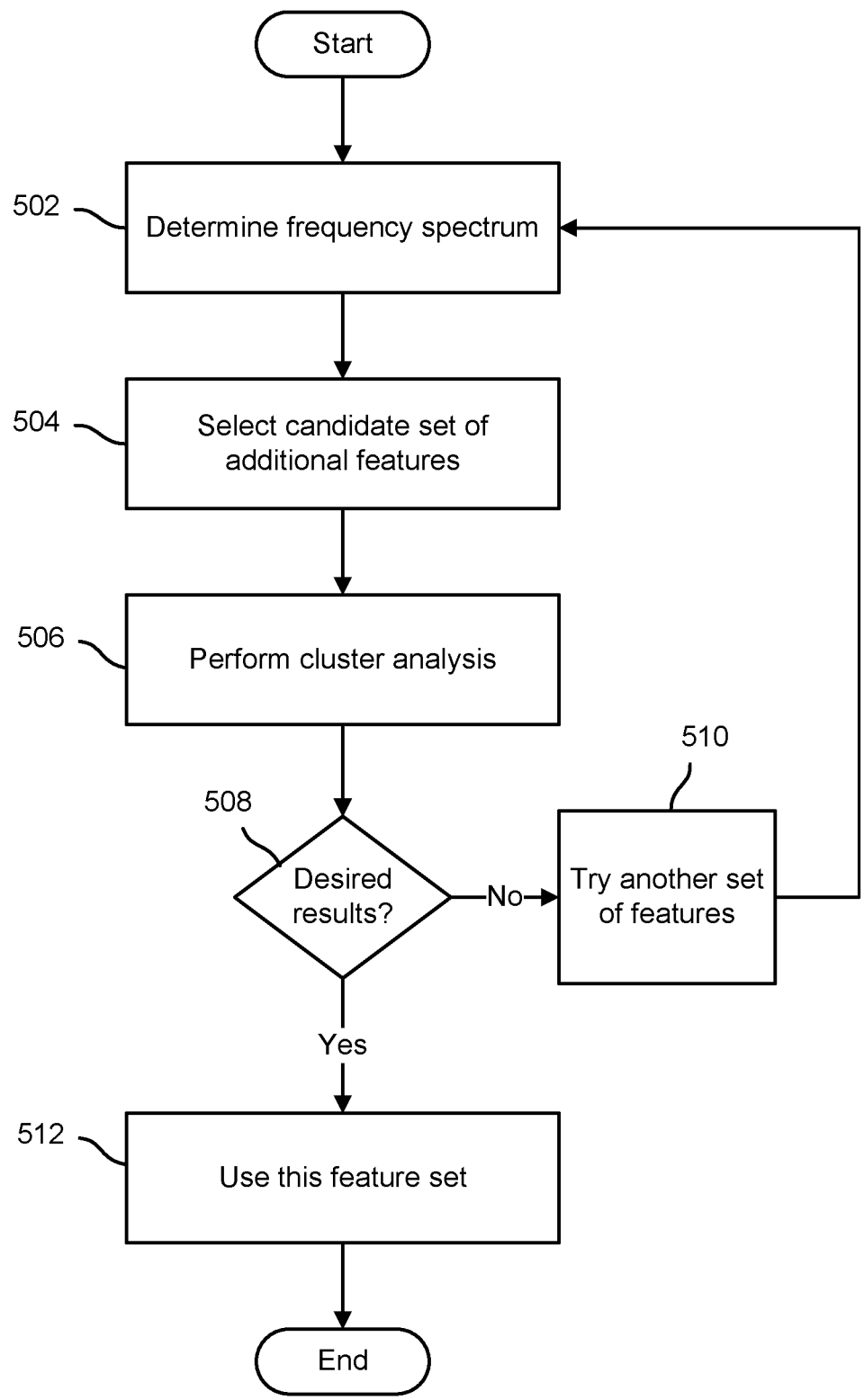
FIG. 5 is a flow chart illustrating an embodiment of a process to determine a feature set to be used to detect anomalies.

FIG. 5 is a flow chart illustrating an embodiment of a process to determine a feature set to be used to detect anomalies. In the example shown, a training set of smart meter data is transformed into the frequency domain, and values associated with the determined frequency spectrum, e.g., based on Fourier transform computed magnitudes, are determined (502). A candidate set of additional features is selected (504). Examples of additional features may include, for example, a customer or account type identifier (e.g., residential vs. commercial user), a zip code or other location identifier, ambient temperature, other environmental variables, etc. A cluster analysis is performed using the respective magnitudes of respective frequencies in the determined frequency spectrum and the candidate additional features (506). If desired results are obtained (508), for example the analysis yields clusters within which most smart meters fall and/or only a relatively few smart meters are detected as anomalies, the determined frequencies and candidate other features used to perform the cluster analysis are selected to be the feature set to be used, along with the resulting clusters, to analyze smart meter data (512). If instead desirable results are not obtained (508), e.g., too many clusters, too few clusters, very large and/or heterogeneous clusters, no clusters, too many meters fall outside clusters, etc., then a different candidate feature set may be evaluated (510), in this example through a further iteration of steps 502, 504, 506, and 508. In some embodiments, a feature set that did not produce desired results may be used again, but with a different set of meters, e.g., a subset of the meters included in the previous iteration.

Figure 6:
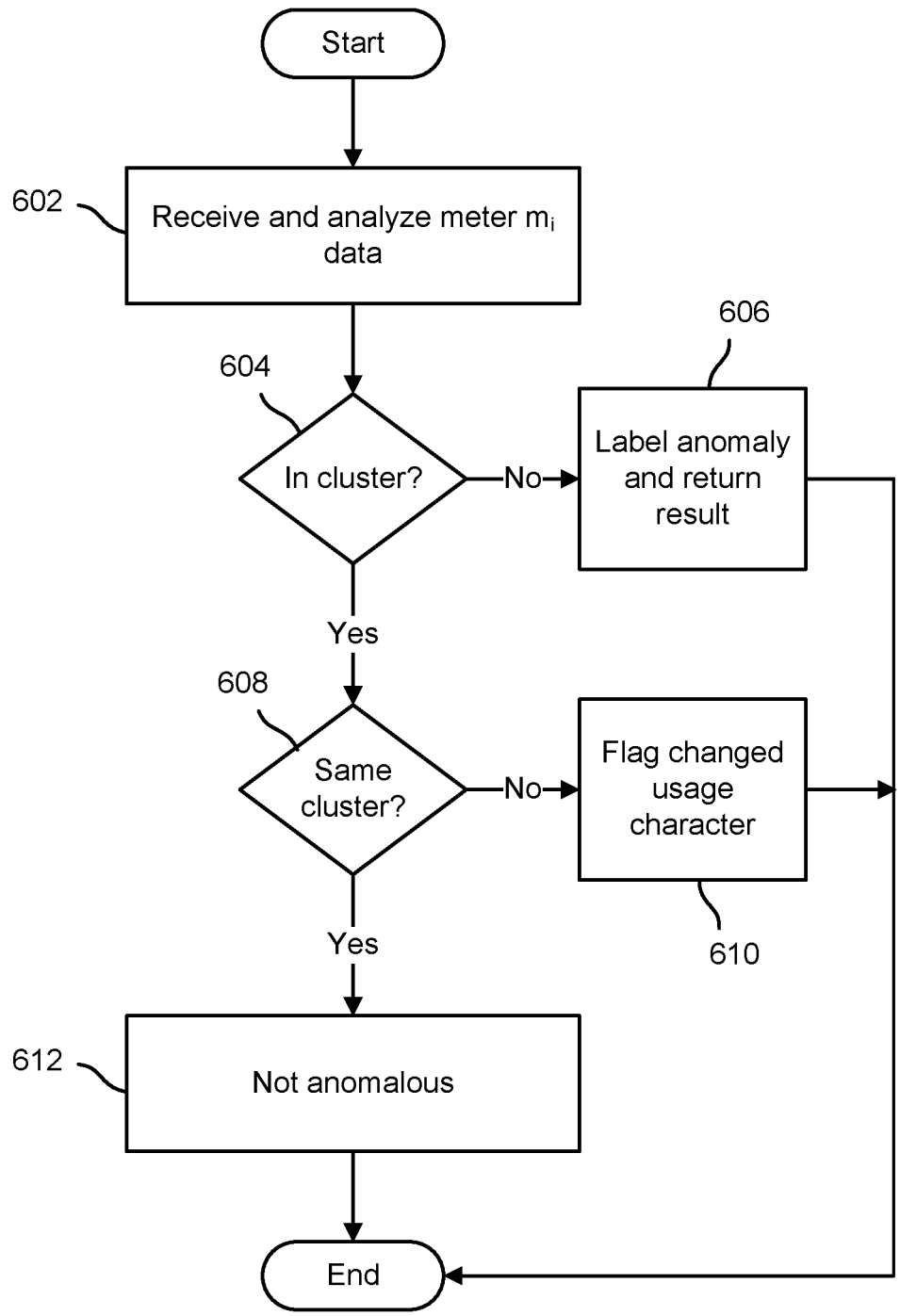
FIG. 6 is a flow chart illustrating an embodiment of a process to detect anomalies.

FIG. 6 is a flow chart illustrating an embodiment of a process to detect anomalies. In various embodiments, a meter may be detected as anomalous based either on a determination that the meter does not fall within any identified cluster or that the meter has jumped from one cluster to a different one. In the example shown in FIG. 6, smart meter data from a meter $m_i$ is received and analyzed (602), e.g., together with corresponding data from a large number of meters. If the meter $m_i$ is determined not to fall within a prescribed distance of a cluster centroid determined via cluster analysis (604), the meter is determined to be anomalous (606). If the meter $m_i$ is determined to fall within a cluster determined via cluster analysis (604), but the cluster within which it now falls is different from one with which it had been associated previously (608), e.g., based on usage and/or other data from a prior period, then the meter $m_i$ is flagged or otherwise identified as being associated with a possible change in the character of usage, for example from a residential usage to a commercial or other usage pattern. If the meter $m_i$ falls with a same cluster as in prior analyses (604, 608), the meter $m_i$ is determined to be non-anomalous (i.e., normal usage) (612).

Techniques disclosed herein may enable the large volumes of data generated by smart meters to be used to distinguish between normal and anomalous consumption patterns, including in various embodiments the ability to classify meters (e.g., through cluster analysis as disclosed herein), determine and characterize normal usage (e.g., attributes and patterns associated with meters in a cluster, label or otherwise categorize anomalies, and take responsive action based on the classification and/or labeling of anomalies.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
receiving for each of a plurality of resource consumption nodes a time series data including for each of a series of observation times a corresponding resource consumption data associated with that observation time;
transforming at least a portion of the time series data, for each of at least a subset of the plurality of resource consumption nodes, into a frequency domain;
using a feature set based at least in part on the resource consumption data as transformed into the frequency domain to detect that resource consumption data associated with a particular resource consumption node is anomalous;
determining whether to initiate an automated responsive action in response to the detection that resource consumption data associated with a particular resource consumption node is anomalous;
determining a type of anomaly associated with the resource consumption data associated with the particular resource consumption node, the type of anomaly being determined based at least in part on a cluster of other time series data that is different from a set of time series data that is determined to be non-anomalous; and
selecting at least one responsive action from a set of a plurality of responsive actions to be performed based at least in part on one or more anomalies and the type of anomaly, the selecting the at least one responsive action comprising selecting a type of investigation to be initiated based at least in part on the type of anomaly.

2. The method of claim 1, further comprising:
computing a degree of confidence associated with a detection that resource consumption data associated with a particular resource consumption node is anomalous,
wherein determination of whether to initiate an automated responsive action based at least in part on the degree of confidence.

3. The method of claim 1, wherein the plurality of resource consumption nodes from which the time series data is received comprise utility users.

4. The method of claim 1, wherein the plurality of resource consumption nodes from which the time series data is received comprise electric utility users and for each resource consumption node the time series data is received from a smart meter associated with the resource consumption node.

5. The method of claim 1, wherein the feature set includes for each of at least a set of frequencies a corresponding magnitude.

6. The method of claim 1, wherein the feature set includes one or more features not derived directly from the resource consumption data as transformed into the frequency domain.

7. The method of claim 6, wherein the feature set includes one or more attributes of a location with which the resources consumption node is associated.

8. The method of claim 6, wherein the feature set includes one or more attributes of a resource consumer with which the resources consumption node is associated.

9. The method of claim 6, wherein the feature set includes one or more environmental attributes associated with the resources consumption node.

10. The method of claim 1, wherein using the feature set based at least in part on the resource consumption data as transformed into the frequency domain to detect that resource consumption data associated with a particular resource consumption node is anomalous includes performing a cluster analysis.

11. The method of claim 10, wherein performing the cluster analysis includes identifying one or more clusters of resource consumption nodes.

12. The method of claim 11, wherein detecting that resource consumption data associated with a particular resource consumption node is anomalous includes determining that the particular resource consumption node falls outside a prescribed threshold distance from a cluster centroid of a corresponding one of said one or more clusters of resource consumption nodes.

13. The method of claim 12, further comprising determining a label of a specific anomaly with which the particular resource consumption node is associated.

14. The method of claim 13, further comprising taking a responsive action determined at least in part based on the label.

15. The method of claim 12, wherein determining that the particular resource consumption node falls outside a corresponding one of said one or more clusters of resource consumption nodes includes determining that the particular resource consumption node has shifted from a being included in a first cluster of resource consumption nodes to instead being included in a second cluster of resource consumption nodes.

16. The method of claim 1, further comprising:
validating the received time series data associated with the plurality of resource consumption nodes and processing the received time series data for missing data.

17. The method of claim 1, wherein a threshold used to detect whether resource consumption data associated with a particular resource consumption node is anomalous is user defined.

18. The method of claim 1, wherein a threshold used to detect whether resource consumption data associated with a particular resource consumption node is anomalous is determined by iterative investigation.

19. The method of claim 1, further comprising:
in response to determining that resource consumption data associated with the particular resource consumption node is anomalous, determining one or more reasons for an anomaly based at least in part on a pattern of the resource consumption data associated with the particular resource consumption node.

20. The method of claim 1, further comprising:
receiving contextual data from one or more contextual sources, wherein the detection that the resource consumption data associated with the particular resource consumption node is anomalous is further based at least in part on the contextual data.

21. The method of claim 20, wherein the contextual data includes one or more of weather information or an environmental variable.

22. The method of claim 1, wherein the type of anomaly is determined based at least in part on the resource consumption data associated with the particular resource consumption node.

23. The method of claim 1, wherein the type of anomaly is determined based at least in part on one or more characteristics or dimensions of the resource consumption data as transformed into the frequency domain and a cluster analysis relating to consumption data from the plurality of resource consumption nodes.

24. The method of claim 1, wherein the determining the type of anomaly comprises determining whether the type of anomaly is a vegetation-related type or a fraudulent usage type.

25. The method of claim 1, wherein the determining the type of anomaly associated with the resource consumption data associated with the particular resource consumption node comprises:
determining the type of anomaly based at least in part on an anomaly associated with an anomalous pattern to which the resource consumption data matches.

26. The method of claim 1, further comprising:
receiving external context information pertaining to a context under which the time series data is received,
wherein the detecting that the resource consumption data associated with the particular resource consumption node is anomalous, or the determining the type of anomaly is further based at least in part on the external context information.

27. The method of claim 26, wherein the external context information includes one or more of information pertaining to weather or environmental conditions, economic activity, character of land use associated with a corresponding resource consumption node, and income of a user or account associated with the corresponding resource consumption node.

28. The method of claim 1, further comprising: in response to selecting the at least one responsive action, invoking the at least one responsive action.

29. The method of claim 1, further comprising: determining to invoke a human operator to perform the at least one responsive action based at in part on a degree of confidence with respect to the determining the type of anomaly.

30. A system, comprising:
a communication interface; and
a processor coupled to the communication interface and configured to:
receive via the communication interface for each of a plurality of resource consumption nodes a time series data including for each of a series of observation times a corresponding resource consumption data associated with that observation time;
transform at least a portion of the time series data, for each of at least a subset of the plurality of resource consumption nodes, into a frequency domain;
use a feature set based at least in part on the resource consumption data as transformed into the frequency domain to detect that resource consumption data associated with a particular resource consumption node is anomalous;
determine whether to initiate an automated responsive action in response to the detection that resource consumption data associated with a particular resource consumption node is anomalous;
determine a type of anomaly associated with the resource consumption data associated with the particular resource consumption node, the type of anomaly being determined based at least in part on a cluster of other time series data that is different from a set of time series data that is determined to be non-anomalous; and select at least one responsive action from a set of a plurality of responsive actions to be performed based at least in part on one or more anomalies and the type of anomaly, the selecting the at least one responsive action comprising selecting a type of investigation to be initiated based at least in part on the type of anomaly.

31. A computer program product embodied in a non-transitory computer readable storage medium and comprising computer instructions for:

receiving for each of a plurality of resource consumption nodes a time series data including for each of a series of observation times a corresponding resource consumption data associated with that observation time;

transforming at least a portion of the time series data, for each of at least a subset of the plurality of resource consumption nodes, into a frequency domain;

using a feature set based at least in part on the resource consumption data as transformed into the frequency domain to detect that resource consumption data associated with a particular resource consumption node is anomalous;

determining whether to initiate an automated responsive action in response to the detection that resource consumption data associated with a particular resource consumption node is anomalous;

determining a type of anomaly associated with the resource consumption data associated with the particular resource consumption node, the type of anomaly being determined based at least in part on a cluster of other time series data that is different from a set of time series data that is determined to be non-anomalous; and selecting at least one responsive action from a set of a plurality of responsive actions to be performed based at least in part on one or more anomalies and the type of anomaly, the selecting the at least one responsive action comprising selecting a type of investigation to be initiated based at least in part on the type of anomaly.

* * * * *